United States Patent [19]

Gentner et al.

[11] Patent Number: 4,904,608
[45] Date of Patent: Feb. 27, 1990

[54] PIN PHOTODIODE HAVING A LOW LEAKAGE CURRENT

[75] Inventors: Jean-Louis Gentner, Saint-Maur; Jean-Noël Patillon, Paris; Catherine Mallet-Mouko, Boissy-Saint-Leger; Gérard M. Martin, Paris, all of France

[73] Assignee: U.S. Philips Corporation, New York, N.Y.

[21] Appl. No.: 297,821

[22] Filed: Jan. 17, 1989

Related U.S. Application Data

[62] Division of Ser. No. 855,234, Apr. 24, 1986, abandoned.

[30] Foreign Application Priority Data

May 3, 1985 [FR] France ................. 85 06753

[51] Int. Cl.⁴ .................. H01L 29/201; H01L 31/18
[52] U.S. Cl. ............................. 437/3; 437/5; 437/154; 437/184; 437/904; 437/987
[58] Field of Search ................. 437/5, 3, 154, 133, 437/167, 184, 245, 987, 904, 906; 156/649; 148/DIG. 31

[56] References Cited

U.S. PATENT DOCUMENTS

| | | | |
|---|---|---|---|
| 3,886,579 | 5/1975 | Ohuchi et al. | 357/13 |
| 4,258,375 | 3/1981 | Hsieh et al. | 357/16 |
| 4,442,444 | 4/1984 | Osaka | 357/13 |
| 4,625,226 | 11/1986 | Antell | 357/30 |
| 4,651,187 | 3/1987 | Sugimoto et al. | 357/30 |
| 4,656,494 | 4/1987 | Kobayashi et al. | 357/30 |

FOREIGN PATENT DOCUMENTS 0156156  10/1985  European Pat. Off.
169888    6/1982  Japan.

OTHER PUBLICATIONS

Hasegawa et al., Extended Abst. 16th Conf. Solid State Devices and Mat'l., Japan Soc. Appl. Physics, (1984), pp. 579–582.

*Primary Examiner*—Olik Chaudhuri
*Attorney, Agent, or Firm*—Paul R. Miller

[57] ABSTRACT

A PIN photodiode having a low leakage current comprises a substrate (10) of indium phosphide (InP) which is n+ doped and on whose first surface is formed a layer (11) of indium phosphide (InP) which is n− doped and on which is disposed a MESA structure formed by a layer (12) of gallium indium arsenide (InGaAs) which is n− doped and is moreover constituted by a layer (13, 113, 213) of the p+ type formed at the surface, at the edges and along the circumference of the MESA structure. The structure further comprises a metallic contact (22) formed on the second surface of the substrate and an ohmic contact (21) formed on a part of the p+ layer. The invention is characterized in that the n− doping of the layer of indium phosphide (InP) (11) is chosen to be lower than the n− doping of the layer of gallium indium arsenide (InGaAs) (12), and in that the ohmic contact (21) is formed on a part (213) of the p+ zone located in the layer of indium phosphide (InP) (11) along the circumference of the MESA structure.

2 Claims, 8 Drawing Sheets

PIN PHOTODIODE HAVING A LOW LEAKAGE CURRENT

This is a division of application Ser. No. 855,234, filed April 24, 1986, now abandoned.

The invention relates to a PIN photodiode having a low leakage current comprising a substrate of indium phosphide (InP), which is n− doped and on whose first surface is formed a layer of indium phosphide (InP) which is n− doped and on which is disposed a MESA structure formed by a layer of gallium indium arsenide (InGaAs) which is n− doped, comprising a p+ layer formed at the surface along the edges and along the circumference of the MESA structure and further comprising a metallic contact formed on the second surface of the substrate and an ohmic contact formed on a part of the n+ layer.

BACKGROUND OF THE INVENTION

The invention is used for the detection of radiation in the range of wavelengths between 1 μm and 1.7 μm and more particularly at the wavelengths 1.3 μm and 1.55 μm, for example for applications in the field of telecommunication.

Such a photodiode is known in the prior art from the publication of Katsuya Hasegawa et al in "Extended Abstracts of the 16th International Conference on Solid State Devices and Materials", Kobe, 1984, p. 579–582, C-10-1, entitled "InGaAs PIN photodiode with Low-Dark Current".

This document describes a PIN photodiode constituted by a substrate of indium phosphide (InP) which is n+ doped on whose first surface a layer of indium phosphide (InP) is formed by epitaxy from the liquid phase, which layer is n− doped and whose concentration of charge carriers is of the order of $5 \times 10^{15} cm^{-3}$. A layer of gallium indium arsenide which is n− doped and whose concentration of charge carriers is also of the order of $5 \times 10^{15} cm^{-3}$ is deposited by the same process of epitaxy from the liquid phase on the layer of indium phosphide (InP) of the n− type which is etched so as to form a MESA structure. A layer of the p+ type is then formed by diffusion of Zn ions not only at the surface of the MESA structure, but also along the edges and along the entire circumference. The diffusion depth is 0.5 μm at the surface of the MESA structure in the layer of InP. An ohmic annular contact is then formed by means of an alloy of Ti/Au at the surface of the MESA structure, while a metallic contact of Au/Sn/Au is formed on the surface of the substrate opposite to the MESA structure. Finally, a passivation layer of silicon nitride ($Si_3N_4$) also serving as an antireflection coating is deposited at the center of the ohmic annular contact at the surface of the MESA structure and along the edges and the circumference of the latter.

These photodiodes have three advantages with respect to the prior art devices. First, since the outer edge of the p+ region is situated at the surface of the layer of InP, the leakage current is reduced. Second, the passivation by a layer of silicon nitride extended to the circumference of the diode permits the obtaining of higher quantum efficiency and a favourable lifetime of the diode. Third, the formation of a comparatively thick p+ layer around the MESA structure causes a guard ring of simplified construction to be constituted and causes the tunnel effect to be reduced.

The photodiodes obtained by means of semiconductors of the III-V group are actually of great industrial importance in optical or electro-optical devices operating in the range of wavelengths lying between 1 μm and 1.7 μm. For applications in the field of telecommunication, in which the wavelengths 1.3 μm and 1.55 μm are utilized, the requirements imposed, which are fairly stringent, tend to further improve the results obtained with the diodes described in the aforementioned document.

In fact, these known diodes have beside the qualities mentioned above a given number of disadvantages. More particularly, it is necessary to have a thickness of at least 0.5 μm betweeen the surface on which an ohmic contact is formed—in this case the surface of the layer of InGaAs of the MESA—and the junction in order to avoid the degradation of the junction. However, since this distance is large, the absorption due to the InGaAs material of the p+ type is also large and consequently the efficiency is low. Moreover, the intrinsic capacitance of the diode is high. Finally, in the layers obtained by epitaxy from the liquid phase, it is difficult to control the n− doping and mostly an n− doping is obtained in the layer of InP which proves to be higher than the n− doping obtained in the layer of InGaAS..

SUMMARY OF THE INVENTION

The invention has for its object to provide a solution to these problems. According to the invention a PIN photodiode of the kind defined in the opening paragraph is characterized in that the n− doping of the layer of indium phosphide (InP) is lower than the n− doping of the layer of gallium indium arsenide (InGaAs), and in that the ohmic contact is formed on a part of the p+ zone located in the layer of indium phosphide (InP) along the circumference of the MESA structure.

The intrinsic capacitance of the diode according to the invention is reduced with respect to the prior art mentioned because of the fact that the n− doping of the layer of InP on which the ohmic contact is formed is lower than the n− doping of the layer of InGaAs constituting the MESA structure.

According to a preferred embodiment of the invention, this photodiode is moreover characterized in that the thickness of the p+ layer formed at the surface of the layer of gallium indium arsenide (InGaAs) is smaller than the thickness of the p+ zone formed under the ohmic contact in the layer of indium phosphide (InP).

Because of the fact that the ohmic contact is no longer arranged at the top of the MESA, as was the case according to the prior art, the thickness of the p+ layer under the ohmic contact can be different from that of the p+ layer on the MESA and each of these thicknesses can be optimized.

According to this embodiment, the thickness of the p+ layer at the surface of the layer of gallium indium arsenide can be reduced, which provides the advantage that the efficiency of the diode is increased because the p+ gallium indium arsenide material is highly absorbing in the wavelength range aimed at. On the contrary, the thickness of the p+ layer of indium phosphide under the ohmic contact can be sufficiently large to simplify the formation of the contact and to increase the long-term stability of the contact.

According to a variation of this preferred embodiment, this photodiode is moreover characterized in that the MESA structure thus formed is provided with a layer of indium phosphide (InP) of the p+ type.

A photodiode according to these preferred embodiments can be characterized in that the thickness of the layer of indium phosphide (InP) of the n⁻ type and that of the layer of gallium indium arsenide (InGaAs) are of the order of 3 μm, in that the n⁻ doping of the layer of indium phosphide (InP) is about $2 \times 10^{14}$ cm⁻³, while the n⁻ doping of the layer of gallium indium arsenide (InGaAs) is of the order of 1 to $2 \times 10^{15}$ cm⁻³, and in that the thickness of the p+ zone formed in the layer of indium phosphide (InP) along the circumference of the MESA structure is larger than 0.5 μm, while the thickness of the layer of gallium indium arsenide of the p+ type formed at the surface of the layer of gallium indium arsenide of the n⁻ type is of the order of 0.1 to 0.2 μm.

In this embodiment of the photodiode, all the values of the dopings and thicknesses of the layers are optimum and permit obtaining the lowest possible capacitance, the optimum efficiency, and the highest possible quantum efficiency.

The invention also relates to a method of forming such a photodiode. The photodiodes obtained by means of this method have a low dark current, a low junction capacitance, a high quantum efficiency, and a long lifetime.

A second method of manufacturing, which permits obtaining a photodiode according to the variation of the invention, is also proposed. The photodiodes obtained by means of this method have a particularly simple constructure. Due to the presence of the layer of indium phosphide of the p+ type at the top of the MESA, this layer being perfectly transparent to the radiation having a wavelength of from 1 to 1.7 μm aimed at, the thickness of the p+ layer at the surface of the layer of gallium indium arsenide, which is itself highly absorbing for these wavelengths, can be readily controlled and can thus be limited more adequately. On the other hand, according to this method, the location of the pn junction under the ohmic contact along the circumference of the MESA can also be readily controlled.

BRIEF DESCRIPTION OF THE DRAWINGS

In order that the invention may be readily carried out, it will now be described more fully with reference to the accompanying drawings, in which.

DESCRIPTION OF THE PREFERRED EMBODIMENTS

Figure 1A:
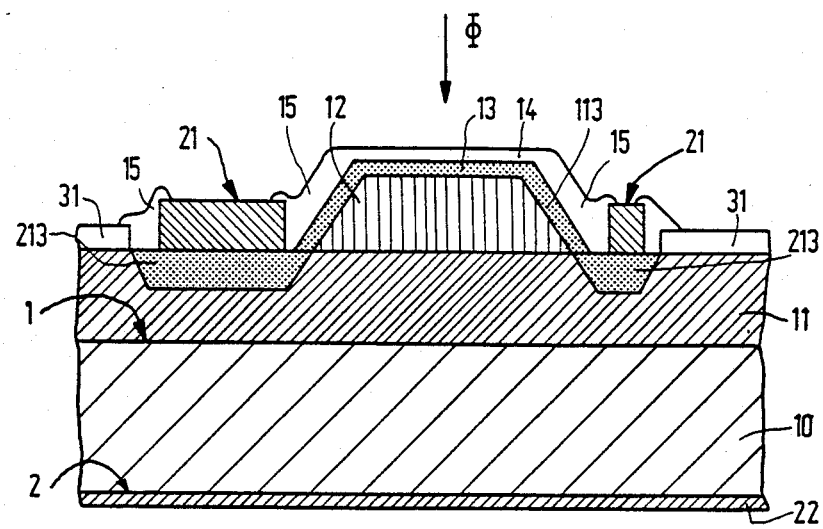
FIG. 1a shows in sectional view the photodiode according to the invention.

As shown in sectional view in FIG. 1a, the PIN photodiode according to the invention comprises a substrate 10 of indium phosphide (InP) of the n⁻ type, a layer 11 of indium phosphide (InP) of the n⁻ type formed on a first surface 1 of the substrate, a MESA structure 12 formed from a layer of gallium indium arsenide (InGaAs) of the n⁻ type, a layer 13, 113 and 213 of the p+ type formed in the n⁻ zones so as to form a pn junction and two contacts, one of which (21) is formed on the p+ zone 213 and the other of which (22) is formed on the second surface 2 of the substrate 10.

This PIN photodiode receives the radiation φ on the upper surface of the MESA structure. The InP/InGaAs materials used render it possible to utilize the diode in the range of wavelengths between 1 μm and 1.7 μm, and more particularly wavelengths utilized in telecommunication, such as 1.3 μm and 1.55 μm.

The layer 13, 113, 213 of the p+ type is formed in such a manner that it covers the surface (for the part 13), the edges (for the part 113), and the circumference (for the part 213) of the MESA. In these conditions, the edge of the pn junction appears in the layer of indium phosphide (InP) 11 and does not appear in the layer 12 of gallium indium arsenide (InGaAs), as is common practice in numerous devices known to those skilled in the art, while the configuration of the diode according to the invention ensures that the leakage current is particularly low. This advantage was known already from the aforementioned prior art publication.

However, according to the invention, the doping of the layer 11 of indium phosphide (InP) is chosen so that it is lower than the doping of the layer 12 of gallium indium arsenide (InGaAs), while on the other hand the ohmic contact 21 is formed at the surface of the p+ zone 213 situated along the circumference of the MESA. The doping of the layer 11 of InP can be of the order of $2 \times 10^{14}$ charge carriers per cm³, while the doping of the layer 12 of InGaAs will preferably be of the order of 1 to $2 \times 10^{15}$ charge carriers per cm³. This doping concentration is greatly different from the doping concentration of the layers of the photodiode described in the aforementioned prior art document, in which the concentrations were approximately equivalent for the two layers and were of the order of $5 \times 10^{15}$ cm⁻³. In order to obtain the desired doping concentration in accordance with the invention, instead of the method of epitaxial growth from the liquid phase used according to the prior art, a method of growth from the vapour phase of organometallic materials will preferably be chosen. According to this method, in fact the residual doping concentrations of each of the layers of InP and InGaAs, respectively, are precisely of the order of the desired concentrations, which leads to a particularly suitable use of the invention. On the contrary, the method of growth from the liquid phase according to the prior art provides layers, whose doping concentrations are mostly contrary to those desired for the layers constituting the photodiode according to the invention.

Due to the fact that the ohmic contact 21 is formed on the layer of InP, whose doping is lower than that of the layer of InGaAs, the junction capacitance of the photodiode thus obtained is considerably reduced with respect to the capacitance of the photodiode according to the prior art.

Moreover, when the ohmic contact 21 is arranged along the circumference of the MESA, two further supplementary advantages are obtained.

First, a high quantum efficiency can be readily obtained. The latter is connected with the thickness of the p+ layer 13 at the surface of the MESA. A very high quantum efficiency is obtained for a thickness of this layer of the order of 0.0 to 0.2 μm.

According to the prior art, the p+ layer at the surface of the MESA must have a thickness of at least 0.5 μm because the contact is arranged there. This disposition involves a disadvantage due to the fact that the p+ InGaAs material is just highly absorbing for the operating wavelengths of the diode (1 to 1.7 μm). Consequently, it is very disadvantageous that a layer of InGaAs of the p+ type should be used having a thickness of 0.5 μm at the surface of the MESA.

Therefore, according to the invention, the desired structure is obtained in that, for example, a p+ diffusion is carried out in such a manner that it advances more rapidly in the InP material than in the InGaAs material, so that, when this p+ diffusion reaches the thickness exceeding 0.5 μm necessary for the formation of a reliable ohmic contact in InP, the thickness of the p+ diffusion in InGaAs at the surface of the MESA is only about 0.1 to 0.2 μm, as a result of which the absorption is reduced and the efficiency is improved.

In an embodiment according to the invention, the concentrations of the constituents of the InGaAs material forming the MESA are such that this material corresponds to the formula $In_{0.53}Ga_{0.47}As$. The thickness of each of the layers of InP and of InGaAs is of the order of 3 μm. The ohmic contact 21 is formed by superimposing layers of chronium/platinum/gold or of platinum/titanium/gold. The contact 22 formed on the back surface 2 of the substrate is formed by superimposing layers of gold/germanium/nickel.

Moreover, a dielectric layer can be formed at the surface of the MESA structure with this dielectric layer having a thickness suitable to form an antireflective layer 14 for the range of operating wavelengths of the photodiode. This dielectric material may be, for example, silicon oxide ($SiO_2$) or silicon nitride ($Si_3N_4$). Finally, a dielectric layer 15 is formed on the edges of the MESA structure, which dielectric layer is intended to form a passivation layer for the device. This dielectric material may be, for example, silicon oxide ($SiO_2$), silicon nitride ($Si_3N_4$) or polyimide.

In these conditions, the photodiode according to the invention has not only the known advantages of the prior art mentioned above, i.e. a very low leakage current, a favourable lifetime and a low tunnel effect, but also the supplementary advantages due to the characteristic structure according to the invention, i.e. a lower junction capacitance, a higher quantum efficiency, and a higher efficiency at the wavelengths used.

Figure 3A:
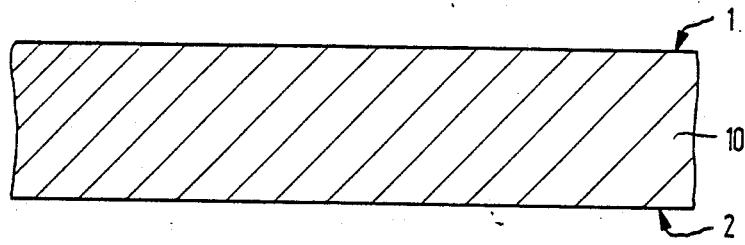
Figure 3B:
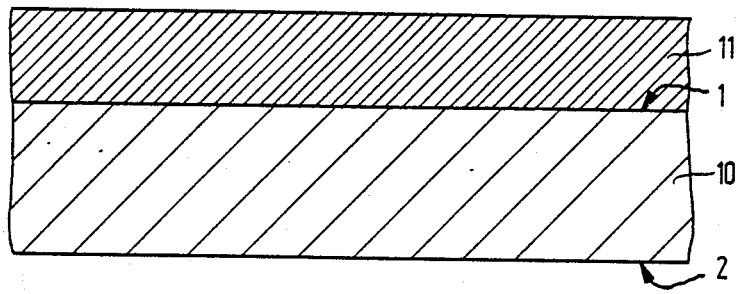
Figure 3C:
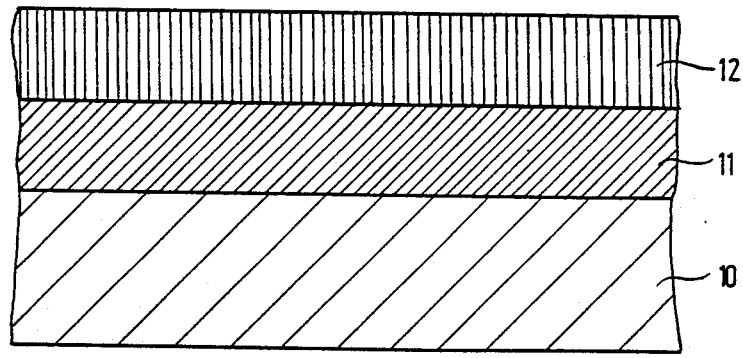
Figure 3D:
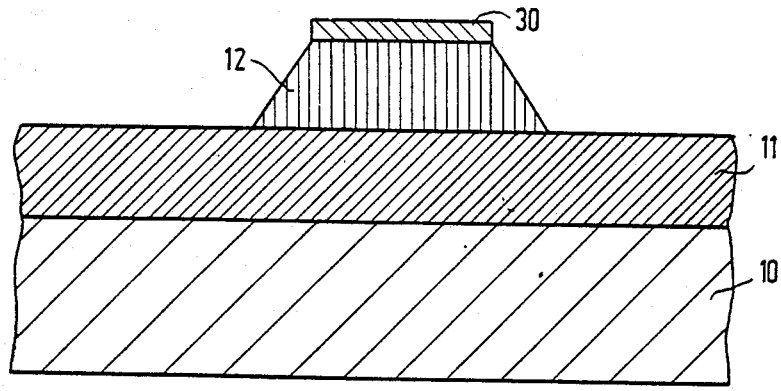
Figure 3E:
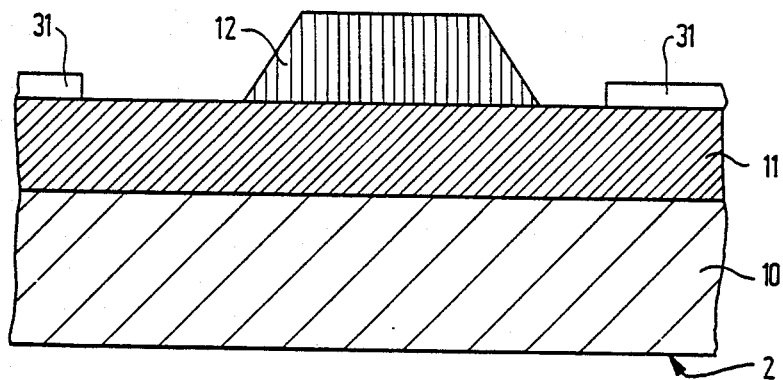
Figure 3F:
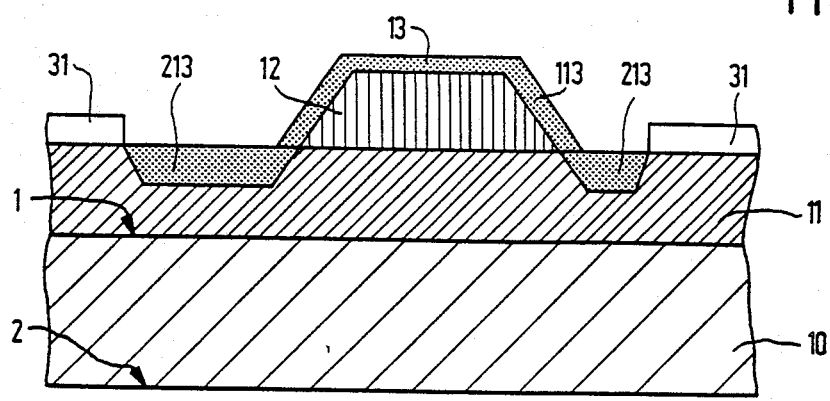
Figure 3G:
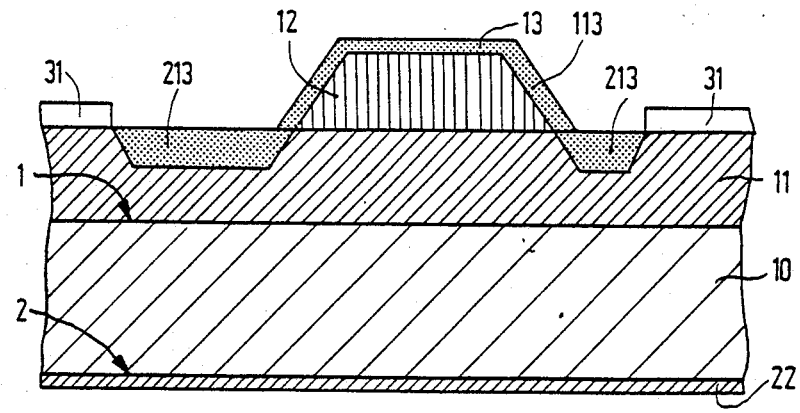
Figure 3H:
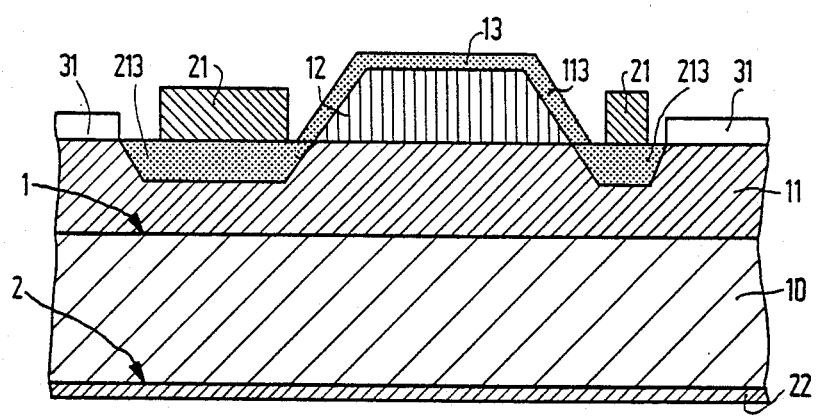
Figure 3I:
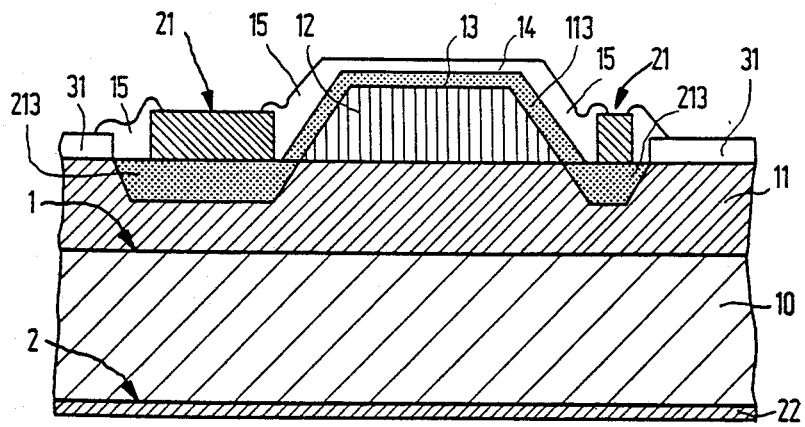

By way of example, a method of manufacturing the photodiode corresponding to this FIG. 1a is now proposed. This method illustrated by FIG. 3a–3i comprises the following successive steps:

(a) forming a substrate 10 of indium phosphide (InP) n⁻ doped by, for example, sulphur atoms S+ (FIG. 3a). This material can be obtained, for example, by the Czochralski method of growth;

(b) depositing on the first surface 1 of this substrate two layers 11 of indium phosphide (InP) of the n⁻ type having a thickness of about 3 μm. The preferential doping level is of the order of $2 \times 10^{14}$ charge carriers per $cm^3$ and can be obtained as residual doping when the layer of InP is processed by a method of epitaxial growth from the vapour phase of organometallic materials (FIG. 3b);

(c) depositing on the layer 11 of InP a layer 12 of gallium indium arsenide (for example $In_{0.53}Ga_{0.47}As$), whose lattice parameter is adapted to the lattice parameter of the preceding layer, of the n⁻ type having a thickness of about 3 μm. The preferential doping level is of the order of 1 to $2 \times 10^{15}$ and can be formed by the residual doping obtained when the layer of InGaAs is processed by a method of epitaxial growth from the vapour phase of the organometallic materials. In all cases, the doping level of the layer of InP has to be chosen lower then the doping level of the layer of InGaAs in order to obtain the reduction of the junction capacitance of the finished device (FIG. 3c);

(d) protecting, for example, by a mask 30 the surface intended to form the MESA and selectively etching the layer of gallium indium arsenide (InGaAs) outside the protected zone in such a manner that the layer 11 of InP appears around the MESA, which is constituted by the protected part of the layer 12 of InGaAs (FIG. 3d), and subsequently eliminating the mask 30. The step of selectively etching the InGaAs material can be effected chemically by a solution of sulphuric acid and by a subsequent rinsing in water;

(e) depositing on the layer 11 of indium phosphide (InP) a dielectric layer 31 defining an opening having a diameter larger than the diameter of the MESA around the MESA. This opening is intended to limit the diffusion of the p+ region. The dielectric material may be silicon oxide ($SiO_2$) or silicon nitride ($Si_3N_4$), which compounds are given by way of non-limitative examples (FIG. 3e);

(f) diffusing in the opening of the dielectric layer 31 atoms such as, for example, Zn atoms in order to form the p+ layer, which layer is designated by reference numeral 13 at the surface of the MESA, by reference numeral 113 at the edges and by reference numeral 213 along the circumference of the MESA, by a method using a sealed ampulla in such a manner that the diffusion depth in the layer of InGaAs at the surface of the MESA is smaller than the diffusion depth in the layer of InP along the circumference of the MESA. Preferably, the diffusion depth in the layer of InP along the circumference of the MESA will reach at least 0.5 μm, while the diffusion depth in the layer of InGaAs at the surface of the MESA will be of the order of 0.1 to 0.2 μm (FIG. 3f);

(g) forming a metallic contact 22 on the back surface 2 of the substrate 10, for example, by successive evaporations of gold, germanium and nickel so as to form a superimposed structure of layers (FIG. 3g);

(h) forming on the part 213 of the p+ zone situated in the layer of InP along the circumference of the MESA an ohmic contact 21. This contact can be obtained by successive evaporations of chrominium, platinum and gold or of platinum, titanium and gold so as to form superimposed layers (FIG. 3h);

(i) forming by means of a dielectric material, such as, for example, silicon oxide ($SiO_2$) or silicon nitride ($Si_3N_4$) an antireflective layer 14 at the surface of the MESA, the thickness of this layer being such that it has a transmission maximum in the range of operating wavelengths of the photodiode (FIG. 3i);

(j) forming on the edges of the MESA a dielectric layer 15 intended to form a passivation layer for the photodiode. This layer may consist of the same material as or of a material compatible with, the antireflective layer (FIG. 3i). This may therefore be, for example, silicon oxide, silicon nitride or polyimide.

This manufacturing method is given only by way of example, because it is quite clear that the layers 13, 113, 213 of gallium indium arsenide and indium phosphide of the p+ type may also be formed by the combination of an epitaxial growth for one part (layer 13) and of a diffusion for another part (113 and 213).

Figure 1B:
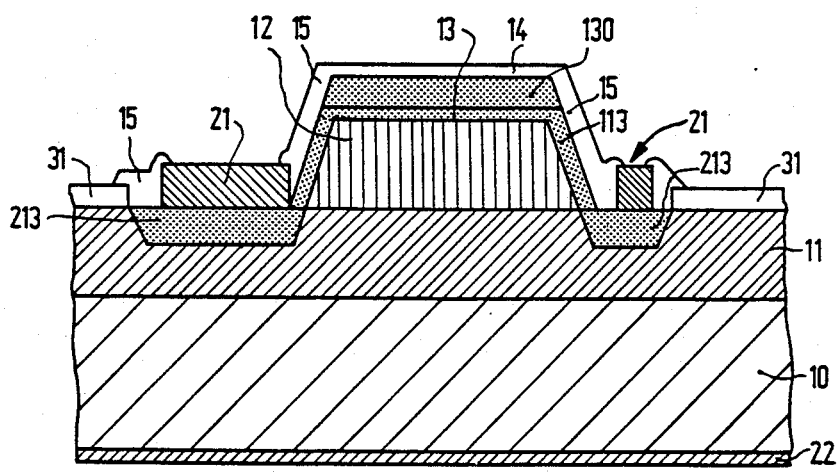
FIG. 1b shows in sectional view the photodiode according to a variation of the invention.

In order to obtain a photodiode for which the location of the pn junction can be more readily controlled, a preferred embodiment of the diode according to the invention is proposed. This preferred embodiment is shown in FIG. 1b.

Figure 4A:
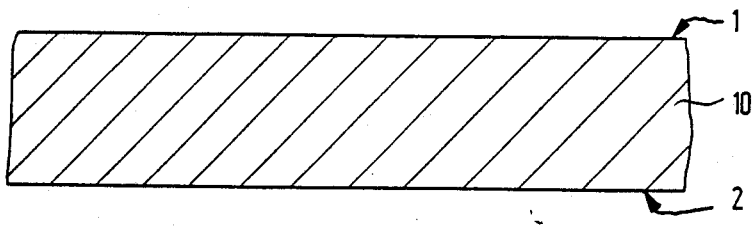
FIGS. 4a, 4b, 4c, 4d, 4e, 4f, 4g, 4h, 4i, and 4j illustrate the different stages of the manufacturing method, by which a diode corresponding to the diode shown in FIG. 1b can be obtained.
Figure 4B:
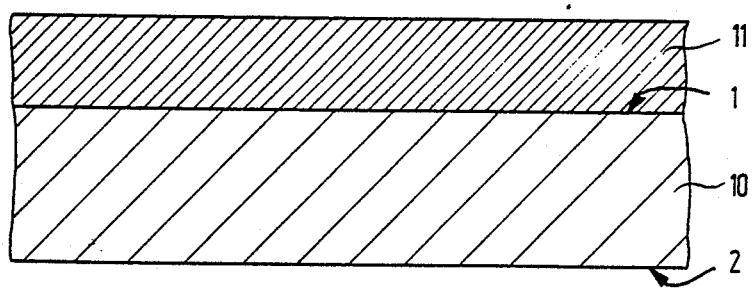
Figure 4C:
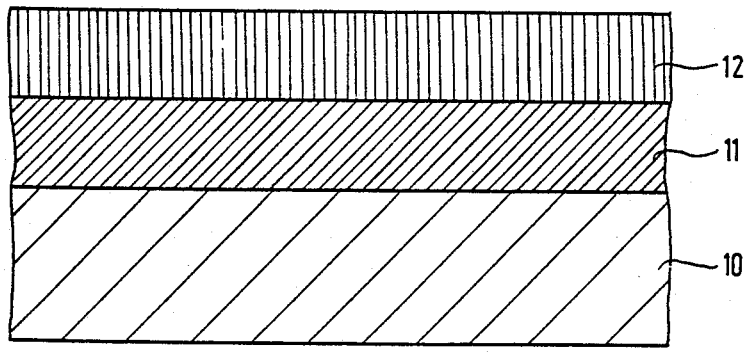
Figure 4D:
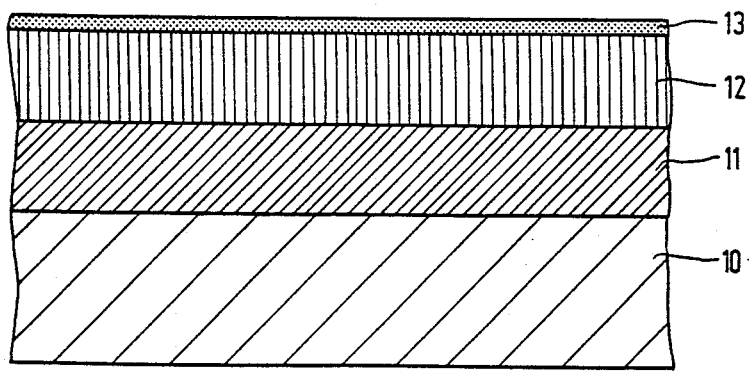
Figure 4E:
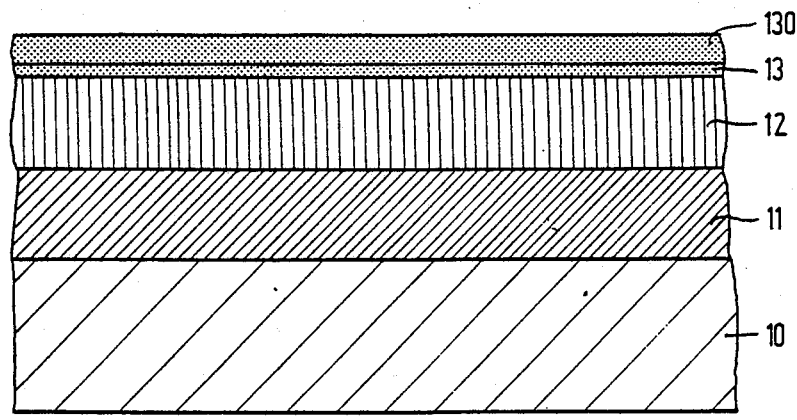
Figure 4F:
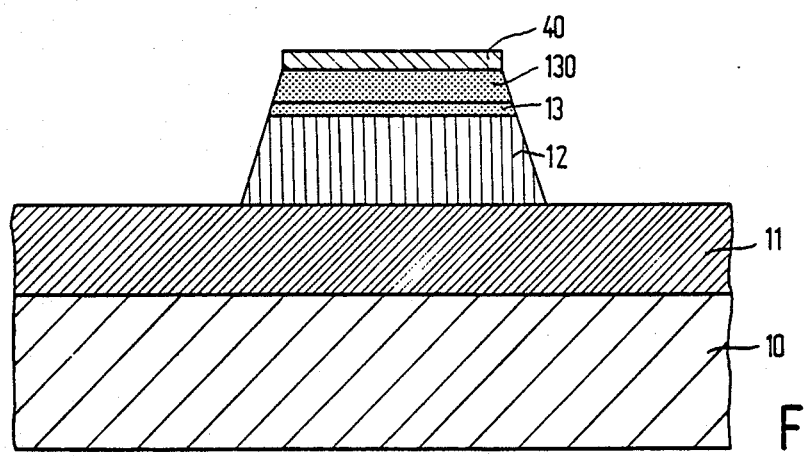
Figure 4G:
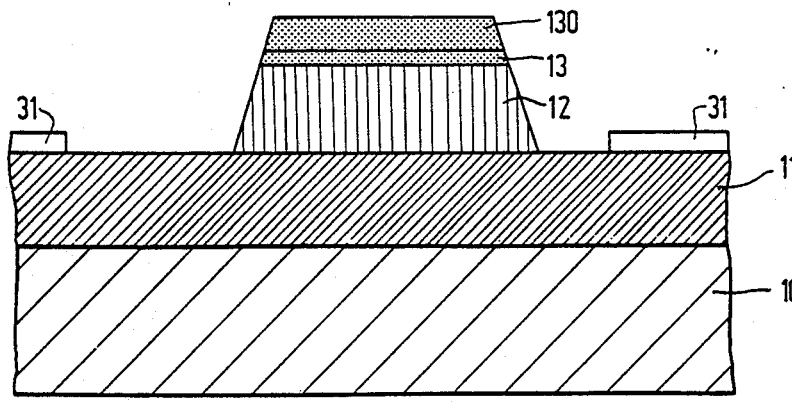
Figure 4H:
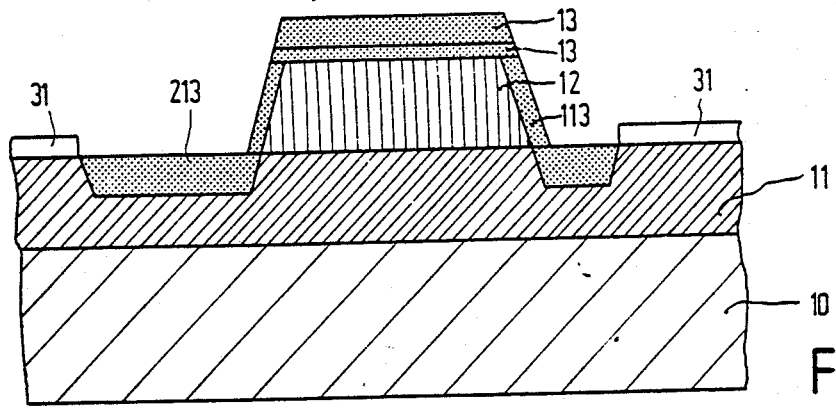
Figure 4I:
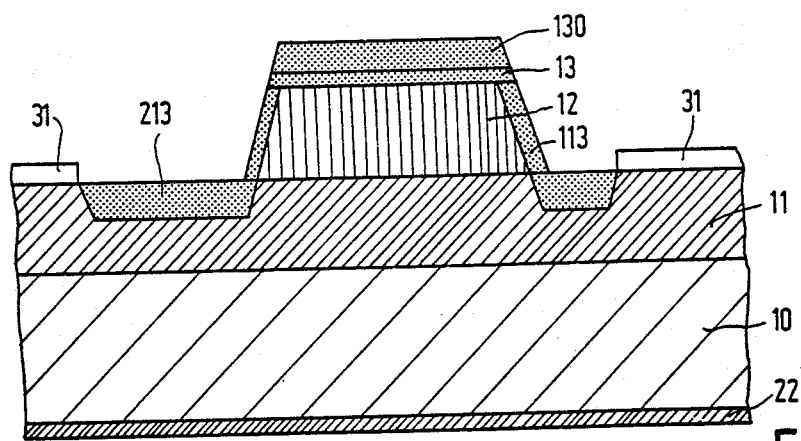
Figure 4J:
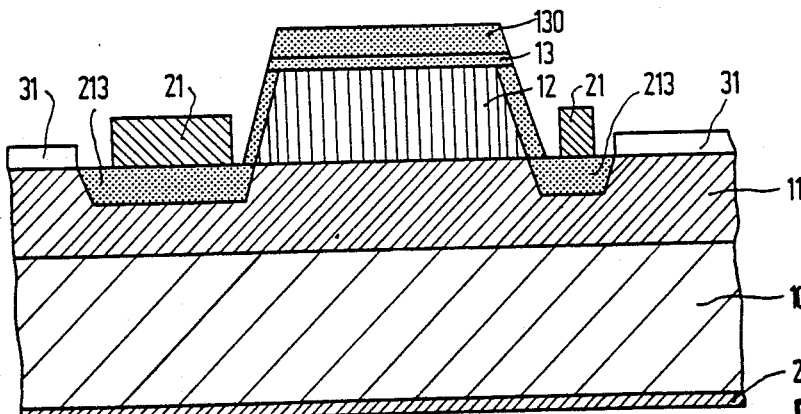

According to this embodiment, the layer 13 of gallium indium arsenide of the p+ type is covered, at the flat surface of the MESA, with a layer of indium phosphide (InP) 130 of the p+ type. In the wavelength range in which the photodiode is used, i.e. 1 to 1.7 μm, the InP material of the p+ type is perfectly transparent to radiation, while, as has been stated above, the p+ InGaAs material is highly absorbing. Therefore, it is extremely important to reduce as far as possible, and at any rate to accurately control, the thickness of the layer 13 of InGaAs of the p+ type. The presence of the layer 130 of InP of the p+ type permits reducing by a maximum amount the thickness of the layer of InGaAs of the p+ type. This variation shown in FIG. 1b affords the advantage that it can be obtained by means of a method, according to which the location of the pn junction can be readily controlled. This manufacturing method is given by way of example hereinafter. It first comprises steps designated by a', b' and c' quite identical to the steps a, b, c of the method described hereinbefore. These steps a', b', c' are illustrated by FIGS. 4a, 4b and 4c, respectively, the layer 11 in this method constituting a first layer of indium phosphide (InP). These operations are then followed by the successive steps of:

(d') depositing a layer 13 of gallium indium arsenide (InGaAs) of the p+ type having a thickness of about 0.1 to 0.2 μm on the preceding layer of gallium indium arsenide (InGaAs) 12 of the n− type, for example by epitaxial growth from the vapour phase, the dopant being, for example, zinc (FIG. 4d);

(e') depositing a second layer of indium phosphide 130 (InP) of the p+ type having a thickness of about 1 μm, for example by epitaxy from the vapour phase with the dopant being, for example, zinc (FIG. 4e);

(f') protecting the surface intended to constitute the MESA, for example by a mask 40 and selectively (for example chemically) etching the second layer of indium phosphide 130 (InP) and the layers 12 and 13 of indium gallium arsenide (InGaAs) (FIG. 4f);

(g') depositing on the first layer 11 of indium phosphide a dielectric layer 31, for example of silicon oxide (SiO₂) or silicon nitride (Si₃N₄) defining an opening having a diameter larger than that of the MESA around the MESA (FIG. 4g);

(h') diffusing atoms, such as, for example, Zn atoms, in a sealed ampulla in the first layer of indium phosphide 11 (InP) around the MESA over a depth of at least 0.5 μm at the edges of the MESA and at the surface of the MESA with this operation producing a layer of the p+ type designated by 113 at the edges and by 213 along the circumference of the MESA in the opening of the dielectric layer 31 formed before (FIG. 4h);

(i') forming a metallization 22 on the back surface of the substrate, for example by means of a structure of superimposed layers of gold/germanium/nickel (Au/Ge/Ni) (FIG. 4i);

(j') forming on the zone 213 of the p+ type formed in the first layer of indium phosphide (InP) 11 along the circumference of the MESA an ohmic contact 21, for example, by means of a structure of superimposed layers of chromium/platinum/gold or of platinum/titanium/gold (FIG. 4j);

(k') forming by means of a dielectric, such as, for example, silicon oxide (SiO₂) or silicon nitride (Si₃N₄) an antireflective layer 14 at the surface of the MESA, which layer is centered at the operating wavelength of the photodiode;

(l') forming at the edges of the MESA a passivation layer 15 by means of a dielectric analogous to and compatible with the dielectric constituting the antireflective layer (FIG. 1b). Consequently, this dielectric may be silicon oxide (SiO₂), silicon nitride (Si₃N₄) or polyimide.

Figure 2:
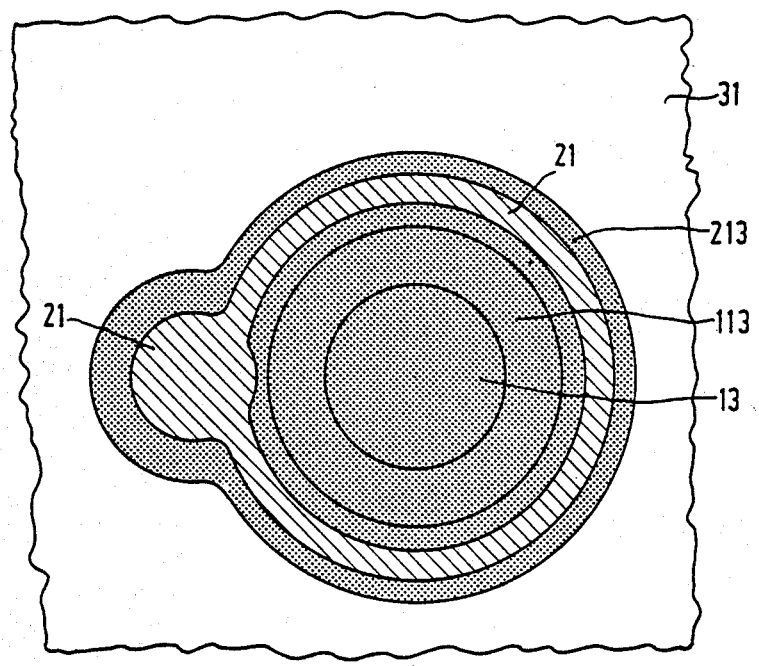
FIG. 2 shows in plan view the photodiodes of FIGS. 1a and 1b, FIGS. 3a, 3b, 3c, 3d, 3e, 3f, 3g, 3h, and 3i illustrate the different stages of the manufacturing method, by which a diode corresponding to the diode shown in FIG. 1a can be obtained.

FIG. 2 shows in plan view one or the other of the diodes shown in sectional view in FIGS. 1a and 1b, respectively. It should be noted that the contact 21 has an annular form. This form is preferable in order to improve the contact on the InP material, which contact is known to give often rise to difficulties.

The MESA structure 13 is circular and the diameter is about 100 μm. The ohmic contact 21 is circular and has a diameter of about 60 μm; it is eccentrically arranged to the MESA so as to be formed on the layer of InP. The zone 213 of the p+ type situated under the contact 21 and along the circumference of the MESA thus forms a guard ring.

The manufacturing methods mentioned by way of example utilize inter alia masking and deposition methods, which are not described here because they are not relevant to the invention and are readily accessible for or known to those skilled in the art.

It is clear that the materials and the methods given by way of example for obtaining the photodiode according to the invention are not limitative and that equivalent materials and similar manufacturing methods may be used for obtaining this photodiode without departing from the scope of the invention.

What is claimed is:

1. A method of manufacturing a photodiode comprising the steps of:
   (a) forming a substrate of indium phosphide of the n+ conductivity type,
   (b) depositing a layer of indium phosphide of the n− conductivity type on a surface of said substrate, said layer having a thickness of about 3μm,
   (c) depositing a layer of gallium indium arsenide of the n− conductivity type on said layer of indium phosphide, said layer of gallium indium arsenide having a doping level higher than that of said n− conductivity type layer of indium phosphide,
   (d) forming at least one mesa region of said layer of gallium indium arsenide by masking said layer of gallium indium arsenide, etching unmasked portions away, and then removing the mask from the surface of said gallium indium arsenide,
   (e) depositing a dielectric layer on said layer of indium phosphide, said dielectric layer being separated from said mesa region to define an opening around said mesa region, said opening having a larger diameter than the diameter of said mesa region,
   (f) diffusing acceptor atoms into said layer of indium phosphide through said opening to a diffusion depth of about 0.5 μm and diffusing said acceptor atoms into said mesa region of gallium indium arsenide to a diffusion depth of about 0.1 to 0.2 μm to produce a layer of the p+ conductivity type at the surface of said mesa region, at the edges of said mesa region, and along the circumference of said opening, (g) forming metallization on a back surface of said substrate, (h) forming an ohmic contact on the p+ zone provided along the circumference of said opening to said layer of indium phosphide, (i) forming a dielectric antireflective layer at said surface of said mesa region, said antireflective layer having a transparence centered at the operating wavelength of the photodiode, and (j) forming a dielectric passivation layer at said edges of said mesa region, said passivation layer being analogous and compatible with said antireflective layer.

2. A method of manufacturing a photodiode comprising the steps of:

(a) forming a substrate of indium phosphide of the n+ conductivity type, (b) depositing a layer of indium phosphide of the n− conductivity type on a surface of said substrate, said layer having a thickness of about 3 $\mu$m, (c) depositing a layer of gallium indium arsenide of the n− conductivity type on said layer of indium phosphide, said layer of gallium indium arsenide having a doping level higher than that of said n− conductivity type layer of indium phosphide, (d) depositing a second layer of gallium indium arsenide of the p+ conductivity type on said layer of gallium indium arsenide of said n− conductivity type, said second layer of gallium indium arsenide having a thickness of about 0.1 to 0.2 $\mu$m, (e) depositing a second layer of indium phosphide of the p+ conductivity type on said second layer of gallium indium arsenide, said second layer of indium phosphide having a thickness of about 1 $\mu$m, (f) forming at least one mesa region by masking said second layer of indium phosphide, etching unmasked portions of said second layer of indium phosphide and underlying portions of said second layer of gallium indium arsenide and underlying portions of said layer of gallium indium arsenide of the n− conductivity type, and then removing the mask, (g) depositing a dielectric layer on said layer of indium phosphide of said n− conductivity type, said dielectric layer being separated from said mesa region to define an opening around said mesa region, said opening having a larger diameter than the diameter of said mesa region, (h) diffusing acceptor atoms into said layer of indium phosphide of said n− conductivity type through said opening to a diffusion depth of about 0.5 $\mu$m and diffusing said acceptor atoms at edges of said mesa region to produce a layer of the p+ conductivity type at edges of said mesa region and along the circumference of said opening, (i) forming metallization on a back surface of said substrate, (j) forming an ohmic contact on the p+ zone provided along the circumference of said opening to said layer of indium phosphide, (k) forming a dielectric antireflective layer at said surface of said mesa region, said antireflective layer having a transparence centered at the operating wavelength of the photodiode, and (l) forming a dielectric passivation layer at said edges of said mesa region, said passivation layer being analogous and compatible with said antireflective layer.

* * * * *